(12) United States Patent
Majumdar et al.

(10) Patent No.: US 9,017,927 B2
(45) Date of Patent: *Apr. 28, 2015

(54) PATTERNING OF TRANSPARENT CONDUCTIVE COATINGS

(71) Applicant: Eastman Kodak Company, Rochester, NY (US)

(72) Inventors: Debasis Majumdar, Manchester, NH (US); Lawrence A. Rowley, Rochester, NY (US); Jayme Diniz Ribeiro, Pittsford, NY (US); David Andrew Johnson, Rochester, NY (US); Todd Mathew Spath, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 85 days.

This patent is subject to a terminal disclaimer.

(21) Appl. No.: 13/775,549

(22) Filed: Feb. 25, 2013

(65) Prior Publication Data

US 2014/0242525 A1   Aug. 28, 2014

(51) Int. Cl.
*G03F 7/26* (2006.01)
*G03F 7/16* (2006.01)

(52) U.S. Cl.
CPC ........................................ *G03F 7/16* (2013.01)

(58) Field of Classification Search
CPC .................................... H01B 1/12; G03F 7/26
USPC ............ 430/199, 311, 348; 156/307.1, 307.3; 427/261
See application file for complete search history.

(56) References Cited

U.S. PATENT DOCUMENTS

| | | |
|---|---|---|
| 3,926,918 A | 12/1975 | Shibata et al. |
| 4,070,189 A | 1/1978 | Kelley |
| 4,731,408 A | 3/1988 | Jasne |
| 4,987,042 A | 1/1991 | Jonas et al. |
| 5,093,439 A | 3/1992 | Epstein et al. |
| 5,300,575 A | 4/1994 | Jonas et al. |
| 5,312,681 A | 5/1994 | Muys |
| 5,354,613 A | 10/1994 | Quintens et al. |
| 5,370,981 A | 12/1994 | Kraft et al. |
| 5,372,924 A | 12/1994 | Quintens et al. |
| 5,391,472 A | 2/1995 | Muys et al. |
| 5,403,467 A | 4/1995 | Jonas |
| 5,443,944 A | 8/1995 | Kraft et al. |
| 5,575,898 A | 11/1996 | Wolf et al. |
| 5,665,498 A | 9/1997 | Savage et al. |
| 5,674,654 A | 10/1997 | Zumbulyadis et al. |
| 5,709,984 A | 1/1998 | Chen et al. |
| 5,716,550 A | 2/1998 | Gardner et al. |
| 5,976,284 A * | 11/1999 | Calvert et al. ................... 156/51 |
| 6,303,277 B1 * | 10/2001 | Hieda et al. .................. 430/322 |
| 7,427,441 B2 | 9/2008 | Majumdar et al. |
| 7,674,854 B2 | 3/2010 | Tada et al. |
| 2001/0018851 A1 | 9/2001 | Horine |
| 2004/0265623 A1 | 12/2004 | Stegamat et al. |
| 2010/0197085 A1 | 8/2010 | Ahn et al. |

FOREIGN PATENT DOCUMENTS

| | | |
|---|---|---|
| EP | 1054414 | 3/2003 |
| WO | 97/18944 | 5/1997 |
| WO | 2012062446 | 5/2012 |

OTHER PUBLICATIONS

Poly(3,4_ethylenedioxythiophene) and Its derivatives: Past, Present and future, by L. Groenendaal, et al, Advanced Materials 2000, 12, No. 7, 481-494.

Inkjet Printing of Oxidants for Patterning of nanometer-Thick Conducting of Polymer electrodes, by Y. Yoshioka & G. Jabbour, Advanced Materials, 2006, 18, 1307-1312.

* cited by examiner

*Primary Examiner* — Kathleen Duda
(74) *Attorney, Agent, or Firm* — Raymond L. Owens

(57) ABSTRACT

A method of patterning a conductive polymer includes providing a conductive polymer layer coated over a first support followed by pattern-wise transferring a layer containing polyvinyl acetal from a second support onto the conductive polymer to form a mask with at least one opening. The masked conductive polymer is subjected to treatment through the opening that changes the conductivity of the conductive polymer by at least one order of magnitude in areas not covered by the mask.

12 Claims, 7 Drawing Sheets

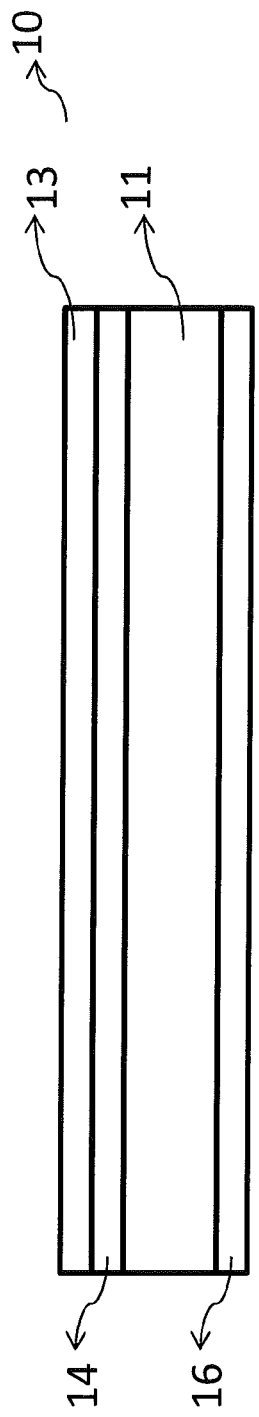
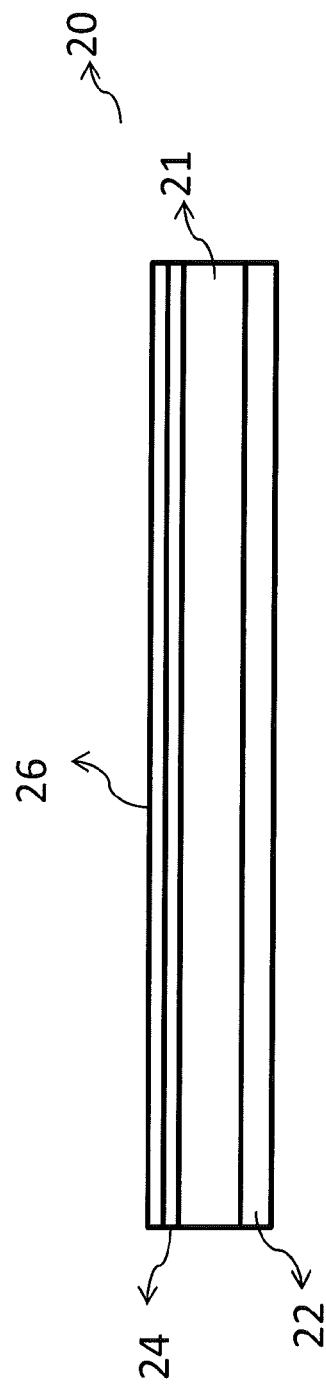
FIG 1
FIG 2

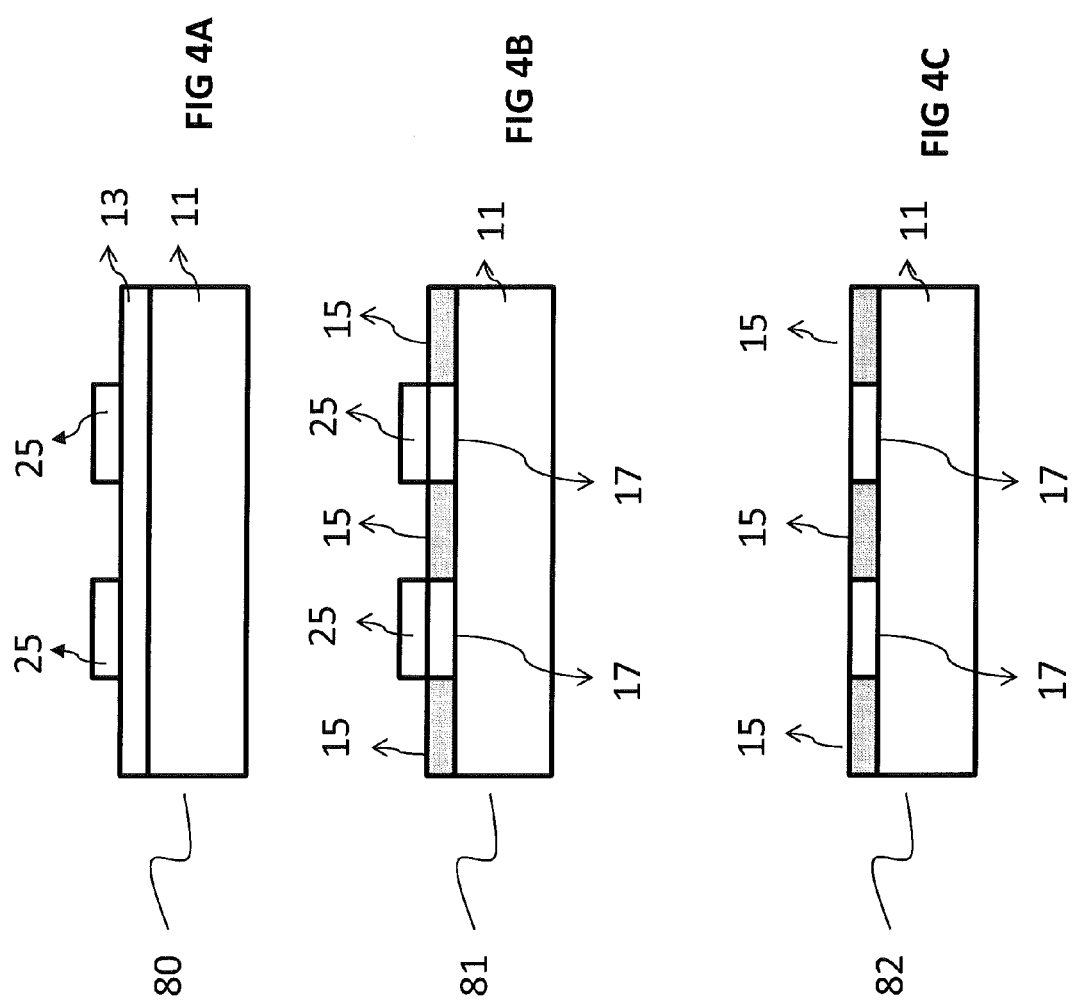

PATTERNING OF TRANSPARENT CONDUCTIVE COATINGS

CROSS REFERENCE TO RELATED APPLICATIONS

Reference is made to commonly assigned, U.S. patent application Ser. No. 13/775,582 filed Feb. 25, 2013, now U.S. Pat. No. 8,709,194, entitled "ASSEMBLING AN ELECTRONIC DEVICE" by Majumdar et al.

FIELD OF THE INVENTION

The field of the invention relates to a method of patterning a conductive polymeric coating and assembling an electronic device.

BACKGROUND OF THE INVENTION

The electrodes for transparent electronic devices, such as touch screens are typically coated out of transparent conductive oxides (TCO), such as indium tin oxide (ITO). However, ITO coatings suffer from the following shortcomings: (a) being an inorganic material, ITO is brittle and therefore prone to cracking, especially on a flexible substrate; (b) ITO coatings involve vacuum sputtering of ITO from a target to the substrate in a batch process, which is slow and expensive; (c) the refractive index mismatch between ITO and the substrate, whether glass or polymer-based, can lead to unacceptable optical characteristics that often require deposition of additional refractive index matching layer(s) on the substrate at additional expense; and (d) there is some uncertainty around the global supply of indium which can add to the cost of raw material, in opposition to the market's demand for low-cost devices.

The use of touch screens in display devices has an advantage of saving space by integrating a screen and a coordinate input unit, as compared to a key input type according to prior technology. Therefore, recently developed display apparatuses with a touch screen have gained widespread use and there is more demand than ever for effective transparent conductors for touch screen applications.

The majority of today's commercialized touch screens can be broadly classified into two types:

(1) The first type is a resistive touch screen where upper/lower electrode layers are spaced from each other by a spacer and are disposed to contact each other by pressing. When the upper substrate on which the upper electrode layer is formed is pressed by input units such as fingers, pen, and so on, the upper/lower electrode layers produce conduction and the contact coordinates are recognized due to the change in voltage according to the change in resistance value in the controller. Typically the electrodes for resistive touch screens need not be patterned.

(2) The second type is the capacitive touch screen, where the electrodes are typically patterned. The upper substrate on which the first electrode pattern is formed and the lower substrate on which the second electrode pattern is formed are separated from each other by an insulator. When the capacitive touch screen is contacted, for example, by human finger, the electrostatic field of the screen is distorted which can be measured as a change in capacitance. With the popularity of multi-touch portable display devices, which generally use capacitive touch screens, there has been a significant need for further development in capacitive touch screen technology and choice of new materials.

Conductive polymers are suitable alternatives to ITO, which can overcome many of the aforesaid disadvantages of transparent conductive oxides. Conductive polymers do not require expensive vacuum deposition equipment and provide coatings having high flexibility. However, there are still some challenges in the patterning of conducting polymer layers that need to be overcome for use in, e.g., high quality capacitive touch screens. Several methods for patterning conductive polymers have been proposed.

WO97/18944 discloses forming a mask over a conductive polymer and then exposing the masked polymer to a solution that: i) removes the conductive polymer; ii) decreases the conductivity of the conductive polymer; or iii) increases the conductivity of the conductive polymer. The examples use time consuming photoresist patterning methods to form the mask.

Jabbour and Yoshioka discloses ink jetting oxidants to pattern PEDOT (Adv. Mater. 2006, 18, 1307-1312). With ink jet deposition, however, it is difficult to control the degree of oxidation. Incomplete oxidation can lead to ineffective electrical isolation and too much oxidation can create an objectionable discoloration. Further, ink jet deposition can result in poor patterning due to ink splashing and running. Ink jet patterning is also disclosed in EP1054414.

US20040265623 and US20100197085 disclose the use of laser ablation to pattern conductive polymers. Although popular, laser ablation is a relatively slow process that can result in unwanted line visibility, damage in the substrate and conductive residue that can cause shorts.

Hence, there is a need to develop methods for patterning conductive polymers that will create optically acceptable patterns, by robust, manufacturable ways that can be incorporated in high quality displays.

SUMMARY OF THE INVENTION

In accordance with the present invention, a method of patterning a conductive polymer comprises:

providing a conductive polymer layer coated over a first support;

pattern-wise transferring a layer containing polyvinyl acetal from a second support onto the conductive polymer to form a mask with at least one opening; and subjecting the masked conductive polymer to treatment through the opening that changes the conductivity of the conductive polymer by at least one order of magnitude in areas not covered by the mask.

These, and other, attributes of the present invention will be better appreciated and understood when considered in conjunction with the following description and the accompanying drawings. It should be understood, however, that the following description, although indicating embodiments of the present invention and numerous specific details thereof, is given by way of illustration and not of limitation. For example, the summary descriptions above are not meant to describe individual separate embodiments whose elements are not interchangeable. Many of the elements described as related to a particular embodiment can be used together with, and interchanged with, elements of other described embodiments. The figures below are not intended to be drawn to any precise scale with respect to relative size, angular relationship, or relative position or to any combinational relationship with respect to interchangeability, substitution, or representation of an actual implementation.

BRIEF DESCRIPTION OF THE DRAWINGS

FIG. 1 shows a receiver element of the present invention.
FIG. 2 shows a donor element of the present invention.

FIGS. 4A, 4B and 4C illustrate a sequence of steps according to an embodiment of the present invention for treating a masked receiver element to alter the conductivity of exposed conductive polymer layer.

DETAILED DESCRIPTION OF THE INVENTION

Figure 3A:
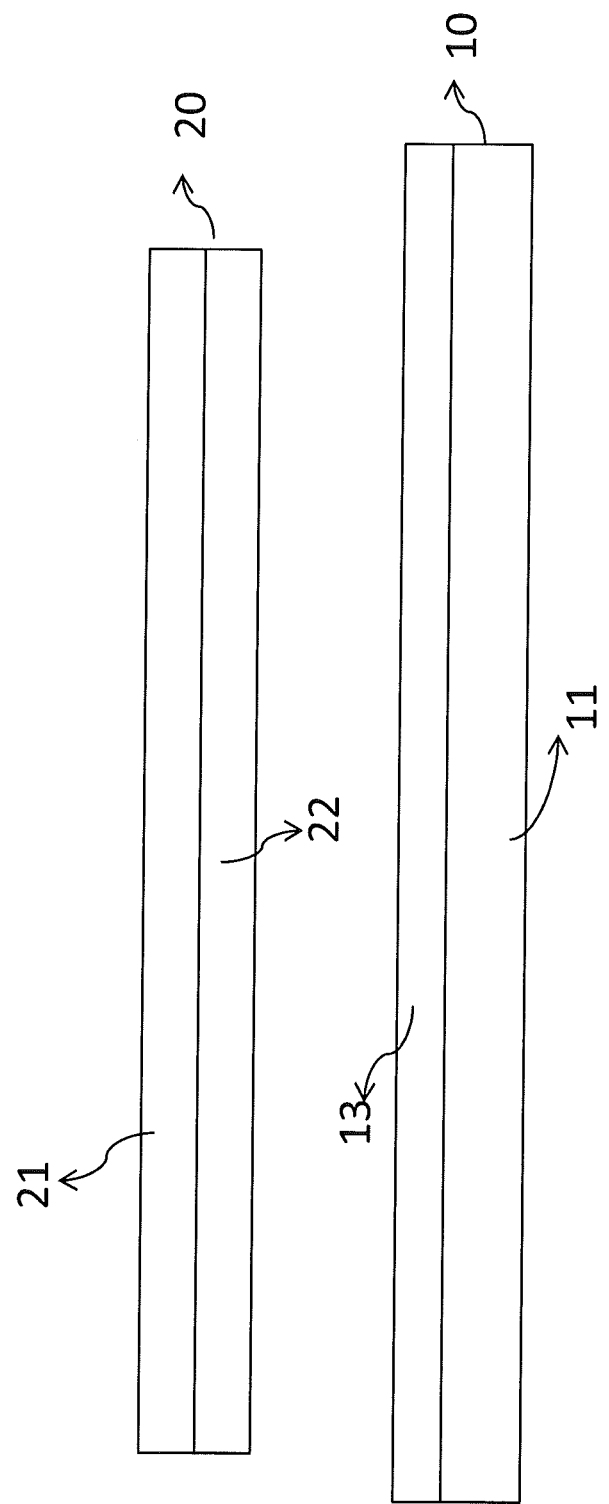
FIGS. 3A, 3B and 3C illustrate a sequence of steps according to an embodiment the present invention for providing a polyvinyl acetal masking polymer onto a receiver element.

The conductive polymer of the invention comprises an intrinsically conductive polymer, especially an electronically conducting polymer. Thus, any of the known electronically conductive polymers, such as substituted or unsubstituted pyrrole-containing polymers (as mentioned in U.S. Pat. Nos. 5,665,498 and 5,674,654), substituted or unsubstituted thiophene-containing polymers (as mentioned in U.S. Pat. Nos. 5,300,575, 5,312,681, 5,354,613, 5,370,981, 5,372,924, 5,391,472, 5,403,467, 5,443,944, 5,575,898, 4,987,042, and 4,731,408) and substituted or unsubstituted aniline-containing polymers (as mentioned in U.S. Pat. Nos. 5,716,550, 5,093,439, and 4,070,189) are included. However, particularly suitable are those, which comprise an electronically conductive polymer in its cationic form and a polyanion, since such a combination can be formulated in aqueous medium and hence environmentally desirable. Examples of such polymers are disclosed in U.S. Pat. Nos. 5,665,498 and 5,674,654 for pyrrole-containing polymers and U.S. Pat. No. 5,300,575 for thiophene-containing polymers. Among these, the thiophene-containing polymers are most preferred because of their light and heat stability, dispersion stability, ease of storage and handling as well as commercial availability in large quantity.

Preparation of the aforementioned thiophene based polymers has been discussed in detail in a publication titled "Poly (3,4-ethylenedioxythiophene) and its derivatives: past, present and future" by L. B. Groenendaal, F. Jonas, D. Freitag, H. Pielartzik and J. R. Reynolds in Advanced Materials, (2000), 12, No. 7, pp. 481-494, and references therein.

In a preferred embodiment, the layer containing the electronically conductive polymer is prepared by applying a mixture comprising:

a) a polythiophene according to Formula I

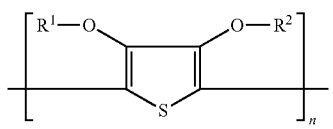

in a cationic form, wherein each of R1 and R2 independently represents hydrogen or a C1-4 alkyl group or together represent an optionally substituted C1-4 alkylene group or a cycloalkylene group, preferably an ethylene group, an optionally alkyl-substituted methylene group, an optionally C1-12 alkyl- or phenyl-substituted 1,2-ethylene group, a 1,3-propylene group or a 1,2-cyclohexylene group; and n is 3 to 1000;

and b) a polyanion compound;

It is preferred that the electronically conductive polymer and polyanion combination is soluble or dispersible in organic solvents or water or mixtures thereof. For environmental reasons, aqueous systems are preferred. Polyanions used with these electronically conductive polymers include the anions of polymeric carboxylic acids such as polyacrylic acids, poly(methacrylic acid), and poly(maleic acid), and polymeric sulfonic acids such as polystyrenesulfonic acids and polyvinylsulfonic acids, the polymeric sulfonic acids being preferred for use in this invention because of its stability and availability in large scale. These polycarboxylic and polysulfonic acids can also be copolymers formed from vinylcarboxylic and vinylsulfonic acid monomers copolymerized with other polymerizable monomers such as the esters of acrylic acid and styrene. The molecular weight of the polyacids providing the polyanions preferably is 1,000 to 2,000,000 and more preferably 2,000 to 500,000. The polyacids or their alkali salts are commonly available, for example as polystyrenesulfonic acids and polyacrylic acids, or they can be produced using known methods. Instead of the free acids required for the formation of the electrically conducting polymers and polyanions, mixtures of alkali salts of polyacids and appropriate amounts of monoacids can also be used. The polythiophene to polyanion weight ratio can widely vary between 1:99 to 99:1, however, optimum properties such as high electrical conductivity and dispersion stability and coatability are obtained between 85:15 and 15:85, and more preferably between 50:50 and 15:85. The most preferred electronically conductive polymers include poly(3,4-ethylene dioxythiophene styrene sulfonate) which includes poly(3,4-ethylene dioxythiophene) in a cationic form and polystyrenesulfonic acid.

Desirable results such as enhanced conductivity of the conductive polymer can be accomplished by incorporating a conductivity enhancing agent (CEA). Preferred CEAs are organic compounds containing dihydroxy, poly-hydroxy, carboxyl, amide, or lactam groups, such as (1) those represented by the following Formula II:

$$(OH)n\text{-}R\text{---}(COX)m \qquad \qquad II$$

wherein m and n are independently an integer of from 1 to 20, R is an alkylene group having 2 to 20 carbon atoms, an arylene group having 6 to 14 carbon atoms in the arylene chain, a pyran group, or a furan group, and X is —OH or —NYZ, wherein Y and Z are independently hydrogen or an alkyl group; or (2) a sugar, sugar derivative, polyalkylene glycol, or glycerol compound; or (3) those selected from the group consisting of N-methylpyrrolidone, pyrrolidone, caprolactam, N-methyl caprolactam, dimethyl sulfoxide or N-octylpyrrolidone; or (4) a combination of the above.

Particularly preferred conductivity enhancing agents are: sugar and sugar derivatives such as sucrose, glucose, fructose, lactose; sugar alcohols such as sorbitol, mannitol; furan derivatives such as 2-furancarboxylic acid, 3-furancarboxylic acid; alcohols such as ethylene glycol, glycerol, di- or triethylene glycol. Most preferred conductivity enhancing agents are ethylene glycol, glycerol, di- or triethylene glycol, as they provide maximum conductivity enhancement.

The CEA can be incorporated by any suitable method. Preferably the CEA is added to the coating composition comprising the electronically conductive polymer and the polyanion. Alternatively, the coated and dried conductive polymer layer can be exposed to the CEA by any suitable method, such as a post-coating wash.

The concentration of the CEA in the coating composition can vary widely depending on the particular organic compound used and the conductivity requirements. However, convenient concentrations that can effectively be employed in the practice of the present invention are about 0.5 to about 25 weight %; more conveniently 0.5 to 10 and more desirably 0.5 to 5.

While the conductive polymer layer can be formed without the addition of a film-forming polymeric binder, a film-forming binder can be employed to improve the physical properties of the layer. In such an embodiment, the layer can comprise from about 1 to 95% of the film-forming polymeric binder. However, the presence of the film forming binder can increase the overall surface electrical resistivity of the layer. The optimum weight percent of the film-forming polymer binder varies depending on the electrical properties of the electronically conductive polymer, the chemical composition of the polymeric binder, and the requirements for the particular application.

Polymeric film-forming binders useful in the conductive polymer layer of this invention can include, but are not limited to, water-soluble or water-dispersible hydrophilic polymers such as gelatin, gelatin derivatives, maleic acid or maleic anhydride copolymers, polystyrene sulfonates, cellulose derivatives (such as carboxymethyl cellulose, hydroxyethyl cellulose, cellulose acetate butyrate, diacetyl cellulose, and triacetyl cellulose), polyethylene oxide, polyvinyl alcohol, and poly-N-vinylpyrrolidone. Other suitable binders include water insoluble aqueous emulsions of addition-type homopolymers and copolymers prepared from ethylenically unsaturated monomers such as acrylates including acrylic acid, methacrylates including methacrylic acid, acrylamides and methacrylamides, itaconic acid and its half-esters and diesters, styrenes including substituted styrenes, acrylonitrile and methacrylonitrile, vinyl acetates, vinyl ethers, vinyl and vinylidene halides, and olefins and aqueous dispersions of polyurethanes, polyesters and polyesterionomers.

Other ingredients that may be included in the conductive polymer layer include but are not limited to surfactants, defoamers or coating aids, charge control agents, thickeners or viscosity modifiers, UV stabilizers, antiblocking agents, coalescing aids, crosslinking agents or hardeners, soluble or solid particle dyes, matte beads, inorganic or polymeric particles, adhesion promoting agents, bite solvents or chemical etchants, lubricants, plasticizers, antioxidants, colorants or tints, and other addenda that are well-known in the art. Preferred bite solvents can include any of the volatile aromatic compounds disclosed in U.S. Pat. No. 5,709,984, as "conductivity-increasing" aromatic compounds, comprising an aromatic ring substituted with at least one hydroxy group or a hydroxy substituted substituents group. These compounds include phenol, 4-chloro-3-methyl phenol, 4-chlorophenol, 2-cyanophenol, 2,6-dichlorophenol, 2-ethylphenol, resorcinol, benzyl alcohol, 3-phenyl-1-propanol, 4-methoxyphenol, 1,2-catechol, 2,4-dihydroxytoluene, 4-chloro-2-methyl phenol, 2,4-dinitrophenol, 4-chlororesorcinol, 1-naphthol, 1,3-naphthalenediol and the like. These bite solvents are particularly suitable for polyester based polymer sheets of the invention. Of this group, the most preferred compounds are resorcinol and 4-chloro-3-methyl phenol. Preferred surfactants suitable for these coatings include nonionic and anionic surfactants. Particularly preferred surfactants include fluorinated surfactants, such as the commercially available Zonyl surfactants supplied by DuPont. Preferred cross-linking agents include but are not limited to, organic compounds including but not limited to, melamine formaldehyde resins, glycoluril formaldehyde resins, polycarboxylic acids and anhydrides, polyamines, polyaziridines, epoxies, carbodiimides, epihalohydrins, diepoxides, dialdehydes, diols, carboxylic acid halide, ketenes, silane compounds and combinations thereof. Preferred cross-linking agents suitable for these coatings include epoxy silane. Suitable silane compounds are disclosed in U.S. Pat. No. 5,370,981. Other preferred cross-linking agents include melamine formaldehyde resins.

The conductive polymer can be coated on the first support by any means known in the art. For example, the conductive polymer can be coated by slot die coating, gravure, spin coating, curtain coating, stamping, bar coating, screen printing, spraying, dip coating, inkjet printing and the like. Typically, the conductive polymer is uniformly coated over the first substrate. However, patches or particular areas can be coated with conductive polymer rather than the entire substrate area. The conductive polymer layer can be provided on one side of the first support or both sides of the first support. If coated on both sides, the conductive polymer layers can have same or different thickness, electrical, optical or other physical properties.

The conductive polymer layer of the invention should contain about 1 to about 10,000 $mg/m^2$ dry coating weight of the electronically conductive polymer. Preferably, the conductive polymer layer should contain about 5 to about 1000 $mg/m^2$ dry coating weight of the electronically conductive polymer. More preferably, the conductive polymer layer should contain about 10 to about 500 $mg/m^2$ dry coating weight of the electronically conductive polymer. The actual dry coating weight of the conductive polymer applied is determined by the properties of the particular conductive polymer employed and by the requirements of the particular application. These requirements can include sheet resistance, transparency, and cost for the layer.

A key criterion of the conductive polymer layer of the invention involves two important characteristics: transparency and surface electrical resistance (SER), also known as the sheet resistance (SR). The stringent requirement of high transparency and low SR demanded by modern display devices can be extremely difficult to attain with electronically conductive polymers. Typically, lower SR values are obtained by coating relatively thick layers which undesirably reduces transparency. Additionally, even the same general class of conductive polymers, such as polythiophene containing polymers, can result in different SR and transparency characteristics, based on differences in molecular weight, impurity content, doping level, morphology and the like.

It has been found, as disclosed in U.S. Pat. No. 7,427,441, that a figure of merit (FOM) can be assigned to the conductive polymer layer. Such FOM values are determined by (1) measuring the visible light transmission (T) and the sheet resistance SR of the conductive polymer layer at various thickness values of the layer, (2) plotting these data in a ln (1/T) vs. 1/SR space, and (3) then determining the slope of a straight line fitting these data points and passing through the origin of such a plot. It is found that ln (1/T) vs. 1/SR plots for electronically conductive polymer layers, particularly those comprising polythiophene in a cationic form with a polyanion compound, produce a linear relationship, preferably one passing through the origin, wherein the slope of such a linear plot is the FOM of the electronically conductive polymer layer. It is also found that lower the FOM value, more desirable is the electrical and optical characteristics of the electronically conductive polymer layer; namely, lower the FOM, lower is the SR and higher is the transparency of the conductive polymer layer. For the instant invention, electronically conductive polymer layers of FOM values <150, preferably <100, and more preferably <50 are most desired, particularly for display applications.

Visible light transmission value T is determined from the total optical density at 530 nm, after correcting for the contributions of the uncoated substrate. A Model 361T X-Rite densitometer measuring total optical density at 530 nm, is best suited for this measurement.

Visible light transmission, T, is related to the corrected total optical density at 530 nm, o.d.(corrected), by the following expression, $$T=1/(10^{o.d.(corrected)})$$

The SR value is typically determined by a standard four-point electrical probe.

The SR value of the electronically conductive polymer layer of the invention can vary according to need. For use as an electrode in a display device, the SR is typically less than 10000 ohms/square, preferably less than 5000 ohms/square, and more preferably less than 1000 ohms/square and most preferably less than 500 ohms/square, as per the current invention.

The transparency of the conductive polymer layer of the invention can vary according to need. For use as an electrode in a display device, the conductive polymer layer is desired to be highly transparent. Accordingly, the visible light transmission % T for the conductive polymer layer of the invention is preferably >65%, more preferably >80%, and most preferably >90%.

The conductive polymer layer of the invention is formed on a first support. This first support can be rigid or flexible. Moreover, this support is generally transparent or translucent and can be colored or colorless. Rigid supports can include glass, ceramic and thick plastics. Flexible supports generally include flexible glass (e.g., Willow glass from Corning), plastics, or composites. Flexible supports are preferred for their versatility and ease of manufacturing, coating and finishing.

Transparent flexible plastic supports are chosen for most typical applications. "Plastic" means a high polymer, typically made from polymeric synthetic resins, which is combined with other ingredients, such as curatives, fillers, reinforcing agents, colorants, and plasticizers. Plastic includes thermoplastic materials and thermosetting materials.

The flexible plastic support should have sufficient thickness and mechanical integrity so as to be self-substrating, yet should not be so thick as to be rigid. Another significant characteristic of the flexible plastic support material is its glass transition temperature (Tg). Tg is defined as the glass transition temperature at which plastic material will change from the glassy state to the rubbery state. It can comprise a range before the material can actually flow. Suitable materials for the flexible plastic support include thermoplastics of a relatively low glass transition temperature, for example up to 150° C., as well as materials of a higher glass transition temperature, for example, above 150° C. The choice of material for the flexible plastic support would depend on factors such as manufacturing process conditions, such as deposition temperature, and annealing temperature, as well as post-manufacturing conditions such as in a process line of a displays manufacturer. Some of the plastic supports discussed below can withstand higher processing temperatures of up to at least about 200° C., some up to 300°-350° C., without damage.

Typically, the flexible plastic support is a polyester including polyethylene terephthalate (PET), polyethylene naphthalate (PEN), polyester ionomer, polyethersulfone (PES), polycarbonate (PC), polysulfone, a phenolic resin, an epoxy resin, polyester, polyimide, polyetherester, polyetheramide, cellulose nitrate, cellulose acetate, poly(vinyl acetate), polystyrene, polyolefins including polyolefin ionomers, polyamide, aliphatic polyurethanes, polyacrylonitrile, polytetrafluoroethylenes, polyvinylidene fluorides, poly(methyl (x-methacrylates), an aliphatic or cyclic polyolefin, polyarylate (PAR), polyetherimide (PEI), polyethersulphone (PES), polyimide (PI), Teflon poly(perfluoro-alboxy) fluoropolymer (PFA), poly(ether ether ketone) (PEEK), poly(ether ketone) (PEK), poly(ethylene tetrafluoroethylene)fluoropolymer (PETFE), and poly(methyl methacrylate) and various acrylate/methacrylate copolymers (PMMA) natural and synthetic paper, resin-coated or laminated paper, voided polymers including polymeric foam, microvoided polymers and microporous materials, or fabric, or any combinations thereof.

Aliphatic polyolefins can include high density polyethylene (HDPE), low density polyethylene (LDPE), and polypropylene, including oriented polypropylene (OPP). Cyclic polyolefins can include poly(bis(cyclopentadiene)). A preferred flexible plastic support is a cyclic polyolefin or a polyester. Various cyclic polyolefins are suitable for the flexible plastic substrate. Examples include Arton® made by Japan Synthetic Rubber Co., Tokyo, Japan; Zeanor T made by Zeon Chemicals L.P., Tokyo Japan; and Topas® made by Celanese A. G., Kronberg Germany. Arton is a poly(bis(cyclopentadiene)) condensate that is a film of a polymer. Alternatively, the flexible plastic support can be a polyester. Preferred polyester is an aromatic polyester such as Arylite. Although the support can be transparent, translucent or opaque, for most display applications transparent members comprising transparent substrate(s) are preferred. Although various examples of plastic supports are set forth above, it should be appreciated that the flexible substrate can also be formed from other materials such as flexible glass and ceramic.

The flexible plastic support can be reinforced with a hard coating. Typically, the hard coating is an acrylic coating. Such a hard coating typically has a thickness of from 1 to 15 microns, preferably from 2 to 4 microns and can be provided by free radical polymerization, initiated either thermally or by ultraviolet radiation, of an appropriate polymerizable material. Depending on the substrate, different hard coatings can be used. When the substrate is polyester or Arton, a particularly preferred hard coating is the coating known as "Lintec." Lintec contains UV cured polyester acrylate and colloidal silica. When deposited on Arton, it has a surface composition of 35 atom % C, 45 atom % 0, and 20 atom % Si, excluding hydrogen. Another particularly preferred hard coating is the acrylic coating sold under the trademark "Terrapin" by Tekra Corporation, New Berlin, Wis.

The most preferred flexible plastic substrate is a polyester because of its superior mechanical and thermal properties as well as its availability in large quantity at a moderate price. The particular polyester chosen for use can be a homo-polyester or a co-polyester, or mixtures thereof as desired. The polyester can be crystalline or amorphous or mixtures thereof as desired. Polyesters are normally prepared by the condensation of an organic dicarboxylic acid and an organic diol and, therefore, illustrative examples of useful polyesters will be described herein below in terms of these diol and dicarboxylic acid precursors.

Polyesters which are suitable for use in this invention are those which are derived from the condensation of aromatic, cycloaliphatic, and aliphatic diols with aliphatic, aromatic and cycloaliphatic dicarboxylic acids and may be cycloaliphatic, aliphatic or aromatic polyesters. Exemplary of useful cycloaliphatic, aliphatic and aromatic polyesters which can be used in the practice of their invention are poly(ethylene terephthalate), poly(cyclohexlenedimethylene), terephthalate) poly(ethylene dodecate), poly(butylene terephthalate), poly(ethylene naphthalate), poly(ethylene(2,7-naphthalate)), poly(methaphenylene isophthalate), poly(g-lycolic acid), poly(ethylene succinate), poly(ethylene adipate), poly(ethylene sebacate), poly(decamethylene azelate), poly(ethylene sebacate), poly(decamethylene adipate), poly (decamethylene sebacate), poly(dimethylpropiolactone), poly(para-hydroxybenzoate) (Ekonol), poly(ethylene oxybenzoate) (A-tell), poly(ethylene isophthalate), poly(tetramethylene terephthalate), poly(hexamethylene terephthalate), poly(decamethylene terephthalate), poly(1,4-cyclohexane dimethylene terephthalate) (trans), poly(ethylene 1,5-naphthalate), poly(ethylene 2,6-naphthalate), poly(1,4-cyclohexylene dimethylene terephthalate), (Kodel) (cis), and poly (1,4-cyclohexylene dimethylene terephthalate (Kodel) (trans). Polyester compounds prepared from the condensation of a diol and an aromatic dicarboxylic acid is preferred for use in this invention. Illustrative of such useful aromatic carboxylic acids are terephthalic acid, isophthalic acid and an α-phthalic acid, 1,3-napthalenedicarboxylic acid, 1,4 naphalenedicarboxylic acid, 2,6-napthalenedicarboxylic acid, 2,7-napthalenedicarboxylic acid, 4,4'-diphenyldicarboxylic acid, 4,4'-diphenysulfphone-dicarboxylic acid, 1,1,3-trimethyl-5-carboxy-3-(p-carboxyphenyl)-idane, diphenyl ether 4,4'-dicarboxylic acid, bis-p(carboxy-phenyl) methane, and the like. Of the aforementioned aromatic dicarboxylic acids, those based on a benzene ring (such as terephthalic acid, isophthalic acid, orthophthalic acid) are preferred for use in the practice of this invention. Amongst these preferred acid precursors, terephthalic acid is particularly preferred acid precursor.

Preferred polyesters for use in the practice of this invention include poly(ethylene terephthalate), poly(butylene terephthalate), poly(1,4-cyclohexylene dimethylene terephthalate) and poly(ethylene naphthalate) and copolymers or mixtures thereof. Among these polyesters of choice, poly(ethylene terephthalate) is most preferred.

The aforesaid first support useful for application in display devices can be planar or curved. The curvature of the support can be characterized by a radius of curvature, which can have any value. Alternatively, the support can be bent so as to form an angle. This angle can be any angle from 0° to 360°. The thickness of the first support can be of any value. For typical applications the thickness can vary from 1 micron to 10 centimeters. In preferred applications, the thickness of the first support can vary from 2 microns to 1000 microns.

Various auxiliary layers can be superimposed on either side of the first support. An auxiliary layer can be any layer other than the conductive polymer layer that is incorporated to provide specific functionality. The location of the auxiliary layers can be between the conductive polymer layer and the first support, over the conductive polymer layer, between the discontinuity of the conductive polymer layer (if it is not continuous) or on the side opposite to the conductive polymer layer. These auxiliary layers can include: antistatic layers, tie layers, primers or adhesion promoting layers, scratch or abrasion resistant layers, curl control layers, conveyance layers, slip or lubricating layers, compliance layers, barrier layers, splice providing layers, release layers, light-to-heat converting layers, UV, visible or infrared light absorption layers, optical effect providing layers, such as antireflective and antiglare layers, dye-containing layers, light scattering layers, waterproofing layers, adhesive layers, magnetic layers, UV or other protective layers, interlayers, and the like. Electrically active layers can also be provided on either side of the support prior to coating of the conductive polymer, such as bus lines, electrical contacts, semiconductor layers or dielectric layers.

An illustrative schematic of a conductive polymer layer on a first support is provided in FIG. 1. A receiver element 10 includes a first support 11 having a conductive polymer layer 13 provided on one side an intervening first auxiliary layer 14 which, for example, can be a primer layer. On the other side of the support (opposite to the conductive polymer layer) is provided a second auxiliary layer 16 which, for example, can be an abrasion resistant layer.

Pattern-wise deposition of a layer containing polyvinyl acetal (PVAc layer) onto the conductive polymer is accomplished to form a mask. Therefore, the layer containing the PVAc polymer can conveniently be referred to as the "masking polymer". The masking polymer needs to protect the underlying conductive polymer from any changes in conductivity during treatment which alters the conductivity of the un-masked region of the conductive polymer layer 13. It should be noted that pattern-wise deposition of the PVAc layer does not necessarily mean that the PVAc layer is in direct contact with the conductive polymer. Thin interlayers can optionally be provided, so long as the conductivity altering treatment is still effective. Such interlayers are used, for example, to affect adhesion, protect the conductive polymer layer during handling and the like.

One advantage of using PVAc as the masking polymer is its versatility and its ability to be deposited by numerous patterning methods. The masking polymer can be readily formulated for deposition by ink jet, gravure and flexography, and can be pattern-deposited by any of these methods. Preferably, the masking polymer is deposited by thermal transfer from a second support. PVAc is readily coatable on to the second support and easily transferable from this second support on to the conductive polymer.

In certain embodiments, the masking polymer should be easily strippable by a solvent or by any other ways without deleteriously affecting the conductive polymer. For some other embodiments, where the masking polymer remains on the conductive polymer as it is assembled to form an electronic device, the masking polymer should remain transparent. There may be other requirements per many other embodiments of the invention. It was found during the course of this invention that PVAc can successfully meet many such requirements.

Polyvinyl acetal is a versatile material with excellent toughness and flexibility, adhesiveness, transparency, non-toxicity, and the like. A preferred method of manufacturing polyvinyl acetal is achieved by reacting polyvinyl alcohol with an aldehyde, preferably in the presence of an acid catalyst. In these reactions, typical polyvinyl acetals comprise a considerable amount of hydroxyl groups. The aldehyde component is not specifically restricted, for example, acetoaldehyde, butylaldehyde and the like can be selected as the aldehyde component. In addition, the polyvinyl acetal resin can be a resin obtained by simultaneously bringing two or more aldehyde components to acetalization, or can have a mixture of two or more polyvinyl acetal resins. Processes for producing polyvinyl acetal are disclosed in U.S. Pat. Nos. 3,926,918 and 7,674,854.

Specific non-limiting examples of the polyvinyl acetal resin which can be used here include S-LEC BL-S, S-LEC BX-1, S-LEC BX-5, S-LEC KS-1, S-LEC KS-3, S-LEC KS-5, and S-LEC KS-10 (tradenames; produced by Sekisui Chemical Co., Ltd.), and DENKA BUTYRAL #5000-A, DENKA BUTYRAL #5000-D, DENKA BUTYRAL #6000-C, DENKA BUTYRAL #6000-EP, DENKA BUTYRAL #6000-CS, and DENKA BUTYRAL #6000-AS (tradenames; produced by Denki Kagaku Kogyo K. K.).

When using thermal transfer, the layer containing polyvinyl acetal is provided on a second support. The second support can be any support such as those described herein above as the first support. For a particularly preferred embodiment, the second support is a polyester such as poly(ethylene terephthalate), or poly(butylene terephthalate), or poly(1,4- cyclohexylene dimethylene terephthalate) or poly(ethylene naphthalate) or copolymers or mixtures thereof. Among these polyesters of choice, poly(ethylene terephthalate) is most preferred.

For a particularly preferred embodiment the thickness of the second support can vary from 1 micron to 1000 micron, more preferably 2 micron to 250 micron and most preferably 4 micron to 150 micron.

The polyvinyl acetal layer of the invention should contain about 1 to about 10,000 mg/m$^2$, preferably about 5 to about 5000 mg/m$^2$ and most preferably 10 to about 2000 mg/m$^2$ of dry coating weight of the polyvinyl acetal.

Although the polyvinyl acetal layer can optionally be provided on both sides of the second support, it is preferred that the PVAc-containing layer is provided on just one side of the second support. The polyvinyl acetal layer on the second support can be a continuous layer or a discontinuous layer such as patches, lines, grids, diamonds or patterns of any other form and shape. Continuous layers or patches are generally preferred. If coated as a discontinuous layer, there can be other functional layers, such as color patches, registration marks, protective layers, or any other layer, in between the discontinuity of the polyvinyl acetal layer.

Other ingredients that optionally can be incorporated in the polyvinyl acetal layer include but are not limited to surfactants, defoamers or coating aids, charge control agents, antistatic or conductive materials, thickeners or viscosity modifiers, UV stabilizers, antiblocking agents, coalescing aids, crosslinking agents or hardeners, soluble or solid particle dyes, matte beads, inorganic or polymeric particles, adhesion promoting agents, bite solvents or chemical etchants, lubricants, plasticizers, antioxidants, colorants or tints, stripping aids that help with the stripping of the layer, and other addenda that are well-known in the art.

The PVAc layer can be coated on the second support by any method known in the art, e.g., by slot die coating, gravure, spin coating, curtain coating, stamping, bar coating, screen printing, spraying, dip coating, inkjet printing and the like.

Various auxiliary layers can be superimposed on either side of the second support. An auxiliary layer can be any layer other than the polyvinyl acetal layer that is incorporated to provide specific functionality. The location of the auxiliary layer can be between the polyvinyl acetal layer and the second support, over the polyvinyl acetal layer, in between the discontinuity of the polyvinyl acetal layer or on the side opposite to the polyvinyl acetal layer. These auxiliary layers can include: antistatic layers, tie layers, primers, or other adhesion promoting layers, strippable layer aiding in the removal of the transferred layer, scratch or abrasion resistant layers, curl control layers, conveyance layers, slip or lubricating layers, compliance layers, barrier layers, splice providing layers, release layers, light-to-heat converting layers, UV, visible or infrared light absorption layers, optical effect providing layers, such as antireflective and antiglare layers, dye-containing layers, light scattering layers, waterproofing layers, adhesive layers, magnetic layers, UV or other protective layers, interlayers and the like.

An illustrative schematic of a polyvinyl acetal layer on second support is provided in FIG. 2. Donor element 20 includes a second support 21 having a polyvinyl acetal layer 22 provided on one side and two auxiliary layers 24 and 26, which for example can be an antistatic layer and a slip layer, respectively.

The polyvinyl acetal layer 22 is pattern-wise transferred from the second support 21 onto the conductive polymer layer 13 on the first support 11 to form a mask. The pattern-wise transfer is preferably achieved through the use of heat, pressure or light.

In a particularly preferred embodiment, the pattern-wise transfer is achieved using a thermal head, such as one used in thermal printers used for thermal transfer systems developed to obtain prints from pictures, which have been produced from a camera or scanning device. Examples of such thermal printers can be found in a typical Kodak kiosk.

In this particularly preferred embodiment of the instant invention, the conductive polymer layer 13 coated over a first support acts as a "receiver" and the polyvinyl acetal layer 22 coated on a second support 21 acts as a "donor". Patternwise transfer of polyvinyl acetal from the second support 21 to the conductive polymer layer 13 of the first support 11 is accomplished in a manner similar to the transfer of dye from the donor to the receiver in a thermal printer. The conductive polymer layer 13 coated on the first support 11 is brought in proximity to a polyvinyl acetal layer 22 coated on the second support 21 such that the conductive polymer layer 13 is facing the polyvinyl acetal layer 22.

Figure 3B:
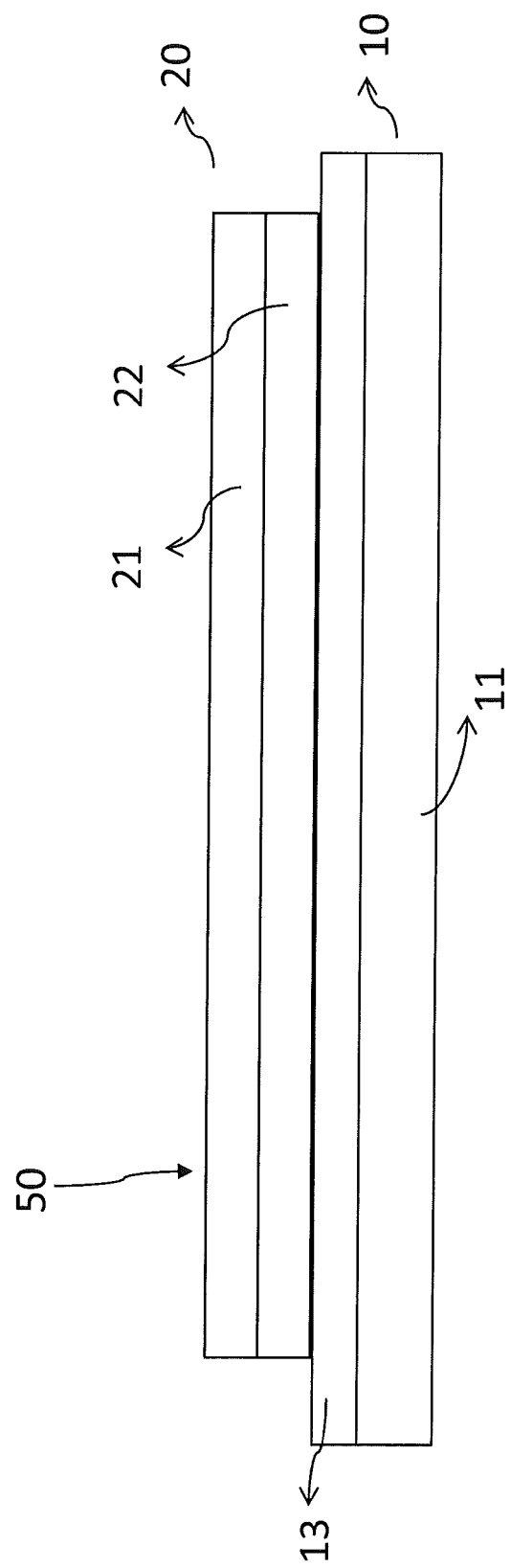

This method is schematically illustrated in FIG. 3A, in which polyvinyl acetal layer 22 is coated on second support 21 to form a donorelement 20 which is placed in proximity to a conductive polymer layer 13 coated on first support 11 to form a receiver element 10, so that the polyvinyl acetal layer 22 faces the conductive polymer layer 13. As per FIG. 3B, the donor element 20 and receiver element 10 are brought in contact with each other under pressure, without altering the face-to-face orientation of the polyvinyl acetal layer 22 and the conductive polymer layer 13, and heat is applied with one (or more) thermal head 50 to cause transfer of the polyvinyl acetal layer 22 from the second support 21 to the conductive polymer layer 13 on the first support 11 in the heated area. This transfer of polyvinyl acetal is made pattern-wise by controlling the thermal energy and relative position of the thermal head 50 with respect to the first and second supports 11, 21, in accordance with a pre-selected digital pattern image. Such thermal transfer of material from a donor to a receiver in the form of a pattern can be routinely achieved using any thermal printer, especially those provided at Kodak photo kiosks. For example, a thermal printer having 300 dot-per-inch (dpi) printhead and prints at a 300 dpi resolution in the x and y direction is suitable for many applications. The individual resistors in the print head can each have, e.g., a resistance in a range of 1000 to 10,000 ohms, preferably 3000 to 7000 ohms. The overall energy required for transfer will depend on the particular material set chosen. The applied energy is generally a function of applied voltage and time in this type of thermal head. Time is typically on the millisecond-scale, e.g., 1 to 10 ms for reasonable throughput. Suitable applied energy densities are typically in a range of 0.5 to 10 J/cm$^2$, and more commonly, 0.5 to 4 J/cm$^2$.

Figure 3C:
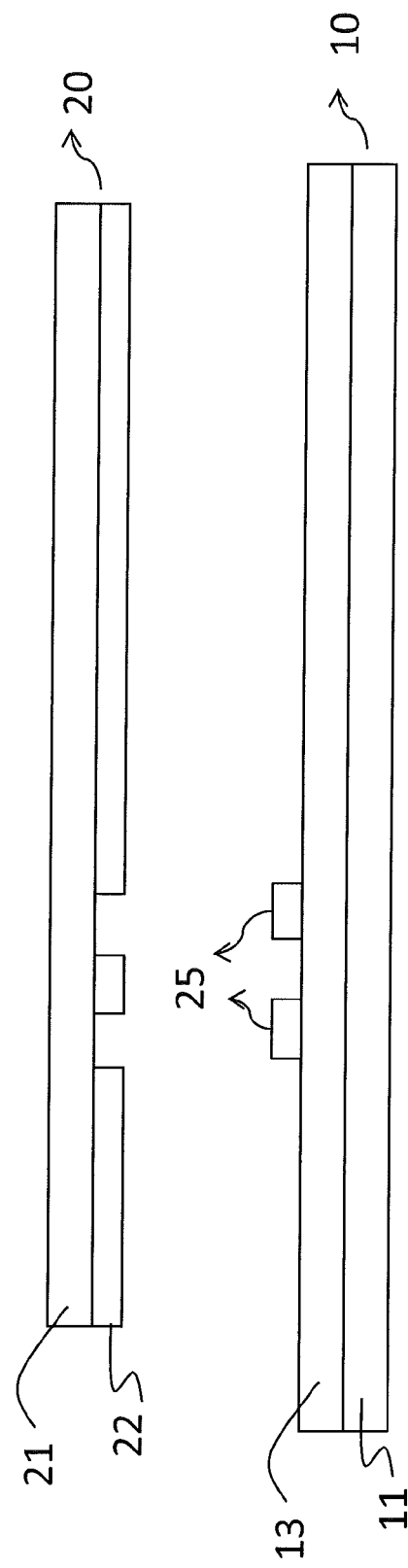

Subsequent to the heating cycle, the first and second supports 11, 21 are separated as per FIG. 3C, with pattern-wise transferred polyvinyl acetal masking polymer 25 from donor element 20 now imaged onto the conductive polymer layer 13 of the receiver element 10.

The thermal transfer method can also use a laser head in addition to or alternative to the thermal head 50. In case of a laser head, photonic energy is provided which can further be converted into thermal energy, preferably by a light-to-heat layer provided on the first or second support 11, 21, in order to facilitate the transfer of the polyvinyl acetal mask. Red and infrared lasers are most common, although shorter wavelengths can be used. Typical lasers suitable for this purpose include, for example, high power (>100 mW) single mode laser diodes, fiber-coupled laser diodes, and diode-pumped solid state lasers (e.g., Nd:YAG and Nd:YLF). The overall energy required for transfer will depend on the particular material set chosen. Laser exposure dwell times can be in the range of, e.g., about 0.1 to 100 microseconds and the laser fluence can be in the range of, e.g., about 0.01 to about 5 J/cm$^2$, more commonly in a range of 0.1 to 2 J/cm$^2$.

Although thermal transfer of the polyvinyl acetal layer 22 is a particularly preferred embodiment of the invention, other methods of transfer are also envisioned.

Pressure can be applied during the transfer operation using either mechanically or acoustically produced force. Mechanical force is produced by a variety of methods well known in the art, for example, by contacting the donor element 20 and receiver element 10 between opposing nip rollers. The nip rollers can be smooth or one or both rollers can have an embossed pattern. Alternatively, the mechanical force is produced by the action of a stylus upon either the donor element 20 or receiver element 10 when they are in intimate contact. Another way of applying mechanical force includes the use of acoustic force. Acoustic force can be produced using a device similar to that disclosed in U.S. Patent Application Publication 2001/0018851 wherein a transducer passes acoustic energy through an acoustic lens which in turn focuses its received acoustic energy into a small focal area of the donor when it is in intimate contact with the receiver element 10.

As per an embodiment of the invention, the polyvinyl acetal layer 22 is pattern-wise transferred from a second support 21 onto the conductive polymer layer 13 on a first support 11 to form a mask; and the masked conductive polymer thus formed is subjected to treatment that changes conductivity by at least one order of magnitude in the areas not covered by the mask.

In the case where treatment increases conductivity, CEA materials previously mentioned can be used. To decrease conductivity, various materials can be used as disclosed in WO97/18944 and EP1054414. The decrease in conductivity, which manifests as an increase in sheet resistance, can preferably be attained by bringing the conductive polymer layer in contact with a medium containing an agent that includes an organic compound capable of releasing chlorine, bromine or iodine, as per Patent Application WO2012062446 A1 by Guntermann and Gaiser, incorporated in its entirety herein by reference.

The organic compound "which is capable of releasing chlorine, bromine or iodine" is preferably understood according to the present invention as meaning an organic compound, which, preferably in a medium preferably after addition of water, releases chlorine in the form of $Cl_2$, HOCl, $OCl^-$ or a mixture of at least two of these chlorine compounds, or bromine in the form of $Br_2$, HOBr, $OBr^-$ or a mixture of at least two of these bromine compounds, or iodine in the form of $I_2$, HIO, $IO^-$ or a mixture of at least two of these iodine compounds. A number of such organic compounds are disclosed in WO2012062446 A1 and are all incorporated herein by reference.

The concentration of the organic compound in the aforesaid medium can vary from 0.1 to 50 wt. %, preferably 0.5 to 35 wt. % and most preferably from 1 to 20 wt. %, relative in each case to the total weight of the composition. It is preferred that the organic compound is dissolved or dispersed in the medium, which is preferably aqueous. The temperature of the medium containing the organic compound can be any temperature between 5° C. and 80° C., but preferably between 10° C. and 50° C. and more preferably between 15° C. and 30° C. and most preferably 25° C. In case of an aqueous medium, the pH can be between 1 and 15, preferably between 2 and 12, and more preferably between 4 and 10.

Subsequent to the treatment that changes the conductivity of the conductive polymer layer 13 by at least one order of magnitude in the areas not covered by the polyvinyl acetal mask, the said mask can optionally be stripped by a stripping process. Such stripping process can involve subjecting the treated conductive polymer layer 13 to a solvent that dissolves the polyvinyl acetal containing masking polymer 25. Suitable stripping solvents can be selected from alcohols, ketones, esters, amides, ethers, aromatic or aliphatic hydrocarbons, chlorinated hydrocarbons, cellosolves and others. For typical use, the stripping solvent is a liquid held at a temperature preferably between 10° C. to 90° C., more preferably between 20° C. and 80° C., and most preferably between 30° C. and 70° C. The stripping solvent can be used with agitation. The stripping process can optionally further involve abrading the surface of the polyvinyl acetal containing masking polymer 25, for example, with a brush or pad.

The aforementioned treatment and optional stripping is illustrated schematically in FIGS. 4A, B, and C. FIG. 4A represents a masked article 80 comprising a conductive polymer layer 13 coated over first support 11, with pattern-wise deposited polyvinyl acetal masking polymer 25. Masked article 80 is subjected to a treatment that can change the conductivity of the conductive polymer layer 13 by at least one order of magnitude in the un-masked area compared to the area under the pattern-wise deposited polyvinyl acetal masking polymer 25. In this particular embodiment, the treatment is to decrease the conductivity. FIG. 4B represents a treated article 81 subsequent to the aforementioned treatment, with a resultant decrease in conductivity of the conductive polymer layer 13, by at least one order of magnitude in the unmasked, treated areas 15 of the conductive polymer, compared to masked, untreated areas 17 under the pattern-wise deposited polyvinyl acetal masking polymer 25. Subsequently, per FIG. 4C, the treated article 81 has been optionally stripped of the pattern-wise deposited polyvinyl acetal masking polymer 25 to form stripped article 82 having a conductive polymer layer 13 comprising treated areas 15 and untreated areas 17, wherein the conductivity of treated areas 15 (originally un-masked areas) has been changed by at least an order of magnitude, compared to that of untreated areas 17 (originally under the pattern-wise deposited polyvinyl acetal masking polymer 25). In a preferred embodiment, the treated areas 15 have a conductivity that is at least an order of magnitude lower than the untreated areas 17, more preferably two orders of magnitude.

EXAMPLES

The polyvinyl acetal used in the examples of the instant invention is supplied by Sekisui Specialty Chemicals as S-LEC-KS 10.

Other materials used in the Invention Examples include the following:

Colloidal silica dispersed in isopropanol commercially available from Nissan Chemicals as IPA-ST.

Poly(divinyl benzene) beads (about 4 μm average diameter).

UV light absorber of the hydroxyphenyl-triazine class commercially is available from CIBA as Tinuvin® 460.

Example 1

(a) Conductive Polymer Layer on First Support

The conductive polymer layer was coated using a slot die from a poly(3,4-ethylene dioxythiophene styrene sulfonate)

based composition, supplied as Clevios FEK by Heraeus, over an acrylate based subbing layer on 125 micron thick PET support. The dry laydown of the conductive polymer layer is estimated to be ~100 mg/m².

(b) Polyvinyl Acetal Layer on Second Support

A KS-10 based composition as described below in Table 1 was coated on a 4.5 micron thick PET, previously coated on the opposite side with a subbing layer of titanium alkoxide and a silicone-free slip layer over the subbing layer.

TABLE 1

| Composition | Example 1 Wet amount in gms | Example 1 Dry lay-down in mg/m² |
|---|---|---|
| KS-10 | 33.25 | 633.91 |
| Poly (divinyl benzene) beads | 5.60 | 106.78 |
| IPA-ST (30% in IPA) | 80.91 | 462.76 |
| Tinuvin ® 460 | 5.65 | 107.64 |
| DEK | 174.59 | |
| Total | 300 | 1311.09 |

The conductive polymer layer 13 on first support 11 and the polyvinyl acetal layer 22 on the second support 21 were introduced in a mechanized version of the Kodak® Photo Printer 6850, with the conductive polymer layer 13 facing the polyvinyl acetal layer 22. Using a 2.5 cm×2.5 cm square pattern, the polyvinyl acetal layer 22 was next transferred from the second support 21 to the conductive polymer layer 13 on the first support 11 under heat and pressure, using the array of thermal resistors at approximately 1.2 J/cm² in the printer. The first and second supports 11, 21 were subsequently peeled apart inside the printer, resulting in a pattern-wise transferred polyvinyl acetal 2.5 cm×2.5 cm square mask on the conductive polymer layer 13 on the first support 11.

A sample of the conductive polymer layer 13 with the pattern-wise transferred polyvinyl acetal mask was next subjected to a treatment that decreases the conductivity of the conductive polymer layer 13. For that purpose the sample with the mask was fully immersed in a 10% aqueous solution of sodium dichlorodiisocyanurate at a pH of 6 following Example 2 of Patent Application WO2012062446 A1 for 2 minutes, followed by thorough water rinse and drying. The effect of the treatment on sheet resistance is summarized below in Table 2:

TABLE 2

| | Before treatment | After treatment |
|---|---|---|
| Sheet resistance in area outside 2.5 cm × 2.5 cm mask | 270 ohm/sq | >10⁹ ohm/sq |

It is clear that the treatment reduces the conductivity (i.e., increases the sheet resistance) of the conductive polymer layer 13 outside the mask by many orders of magnitude.

In order to assess the conductivity of the conductive polymer layer 13 under the polyvinyl acetal mask, the treated sample as described herein above, was washed with ethanol at 40° C. to strip the polyvinyl acetal mask. After stripping, the sample was further rinsed with water and dried. The sheet resistance measured is tabulated in Table 3 below.

TABLE 3

| | In area outside the mask | In area under the mask |
|---|---|---|
| Sheet resistance after stripping polyvinyl acetal mask | >10⁹ ohm/sq | 322 ohm/sq |

It is clear that the polyvinyl acetal mask effectively protected the underlying conductive polymer layer 13 during treatment, i.e., the underlying conductive polymer layer 13 showed only a small increase in sheet resistance—significantly less than one order of magnitude. It is also clear that the polyvinyl acetal mask can be effectively stripped by a solvent, if desired.

In another aspect of the present invention, the mask polymer is not removed, but left in place. Leaving the masking polymer in place can provide various benefits if the masking polymer is transparent. In this aspect, although PVAc is still preferred, other masking polymers can be used such as photoresists. Although the entire prior art for patterning conductive polymers with masks show subsequent removal of the masking polymer, it can be advantageous to leave the masking polymer in place.

First, it should be remembered that the patterned conductive polymer advantageously is difficult to discern by eye. Although pleasing to the user, this creates a serious problem when devices requiring alignment are concerned. For example, pro-cap touch screens are often made using two patterned conductive layers on two substrates. Alignment of the two conductive layers is critical, but if the conductive polymer is patterned well, it can be nearly impossible to see conductive areas versus non-conductive areas. It has been found in the present invention, however, that the patterned mask is very easy to see and can be used for alignment. That is, although made from a material that is largely transparent, the reflectivity or other optical property differences between the mask and the underlying conductive polymer make it possible for the "transparent" mask to be visible or detectable. In this embodiment, the first electronic component includes a substrate and a masked conductive polymer that has been treated to alter its conductivity. The second electronic component, to which the first electronic component is aligned and attached, can be another substrate having a masked conductive polymer that has been treated to alter its conductivity. Alternatively, the second electronic component can be a display device or a glass plate, e.g., "gorilla glass", used as an outer protection layer in an electronic device such as a touch screen. The visible appearance of the masking polymer can be removed by applying a transparent, optically matching adhesive during assembly of the first and second electronic components. An optically matching adhesive has a refractive index that is close to that of the masking polymer, typically within 0.10 units and more advantageously within 0.05 units.

Figure 5A:
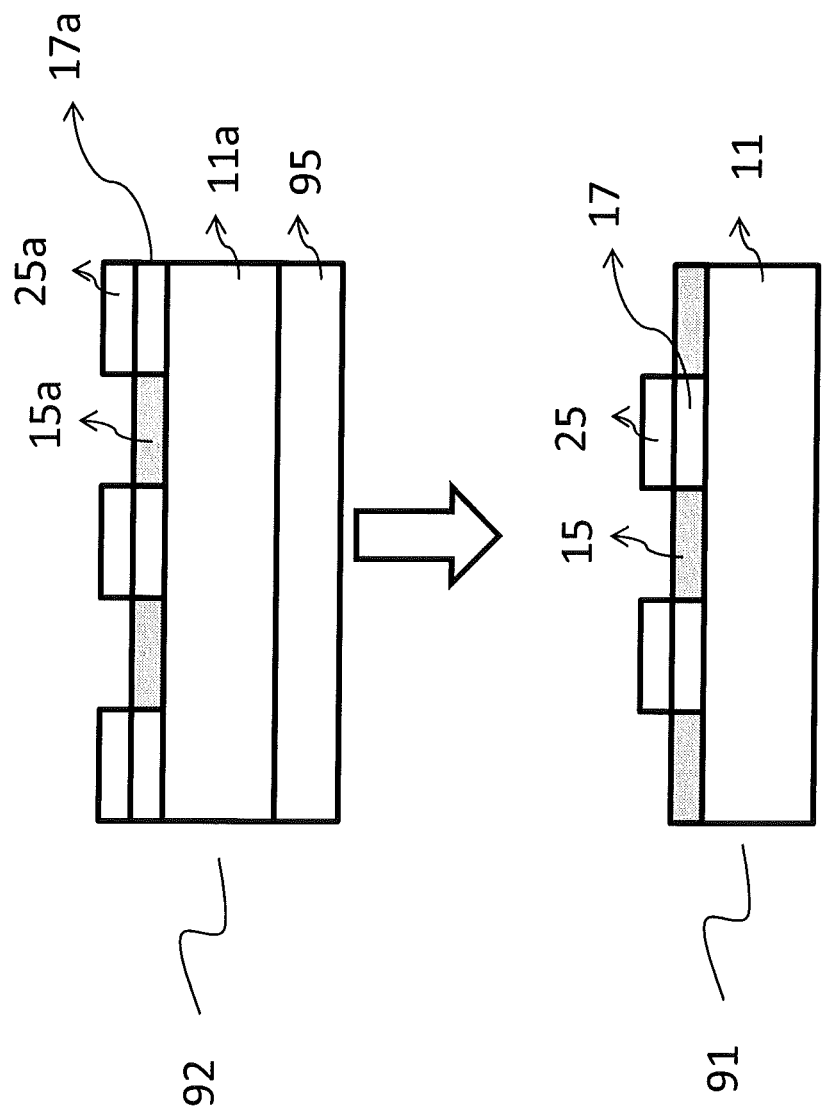
FIGS. 5A and 5B illustrate the assembly of an electronic device according to an embodiment of the present invention.
Figure 5B:
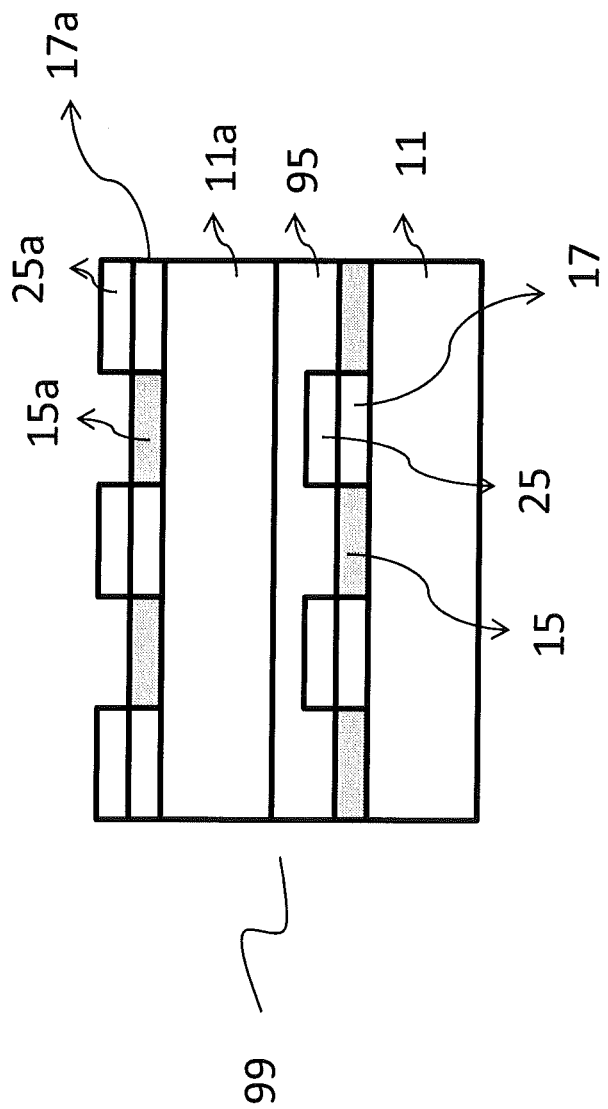

An example is shown in FIGS. 5A and 5B. In FIG. 5A, a first electronic component 91 has a first support 11, patterned polyvinyl acetal masking polymer 25, treated areas 15 and untreated areas 17. The patterned polyvinyl acetal masking polymer 25 is transparent to visible light. A second electronic component 92 has a support 11a (that can be the same or different from the first electronic component support), polyvinyl acetal masking polymer 25a having a different pattern than the first electronic device, treated areas 15a and untreated areas 17a. The patterned polyvinyl acetal masking polymer 25a is also transparent to visible light. The second electronic component 92 further has a layer of an optically matching adhesive 95 on the side opposite the treated 15 and untreated 17 conductive polymer areas. The second electronic component 92 is brought into contact with the first electronic component 91 using masking polymer 25 or 25a or both to aid in alignment. As mentioned above, although generally transparent to visible light, the masking polymer has a detectable optical property difference relative to the non-masked areas. Heat, pressure, photocuring or combinations thereof can be used when bonding the first electronic component 91 to the second electronic component 92 to form an electronic device 99, as shown in FIG. 5B.

In an embodiment, the mask and one or more alignment fiduciary marks are provided in a common step, thereby insuring that the mask and the alignment fiducial are in near perfect registration. For example, a PVAc-based mask and PVAc-based fiduciary marks can be provided in the same thermal transfer step.

Another advantage of leaving the mask in place is that the patterned conductive polymer is likely to be subject to additional handling when assembling into an electronic device. By leaving the masking polymer in place, especially when the treatment was a conductivity deactivating step, the conductive polymer is protected.

In addition, with proper selection of the masking polymer, after treatment, the patterned mask can be fused or spread to form a uniform polymer layer that can serve as an adhesive or a protective layer over the entire patterned conductive polymer. Fusing can be done, e.g., with heat, pressure, solvent vapor or combinations thereof.

The invention has been described in detail with particular reference to certain preferred embodiments thereof, but it will be understood that variations and modifications can be effected within the spirit and scope of the invention.

PARTS LIST 10 receiver element
11 first support
11a support
13 conductive polymer layer
14 first auxiliary layer
15 treated areas
15a treated areas
16 second auxiliary layer
17 untreated areas
17a untreated areas
20 donor element
21 second support
22 polyvinyl acetal layer
24 auxiliary layer
25 polyvinyl acetal masking polymer
25a polyvinyl acetal masking polymer
26 auxiliary layer
50 thermal head
80 masked article
81 treated article
82 stripped article
91 first electronic component
92 second electronic component
95 optically matching adhesive
99 assembled electronic device

The invention claimed is:

1. A method of patterning a conductive polymer comprising:
    a) providing a conductive polymer layer coated over a first support;
    b) pattern-wise transferring a layer containing polyvinyl acetal from a second support onto the conductive polymer to form a mask with at least one opening, wherein the layer containing polyvinyl acetal further includes organic or inorganic particles; and
    c) subjecting the masked conductive polymer to treatment through the opening that changes the conductivity of the conductive polymer by at least one order of magnitude in areas not covered by the mask.

2. The method of claim 1 wherein element (b) includes heating the second support to cause the pattern-wise transfer.

3. The method of claim 1 wherein element (b) includes contacting the layer containing polyvinyl acetal with the conductive polymer and selectively applying heat, light or pressure, or any combination, to cause the pattern-wise transfer.

4. The method of claim 3 wherein element (b) includes applying heat in an energy density range from 0.5 to 4 J/cm$^2$.

5. The method of claim 3 wherein element (b) includes applying laser light in an energy density range from 0.1 to 2 J/cm$^2$.

6. The method of claim 1 wherein the inorganic particles include silica.

7. The method of claim 1 wherein the layer containing polyvinyl acetal further includes a component that promotes stripping of the layer.

8. The method of claim 1 wherein the layer containing polyvinyl acetal further includes a UV light stabilizer.

9. The method of claim 1 wherein the layer containing polyvinyl acetal has a thickness from 0.1 to 10 um.

10. A method of patterning a conductive polymer comprising:
    a) providing a conductive polymer layer coated over a first support;
    b) pattern-wise transferring a layer containing polyvinyl acetal from a second support onto the conductive polymer to form a mask with at least one opening, wherein the layer containing polyvinyl acetal further includes organic or inorganic particles, wherein element (b) includes contacting the layer containing polyvinyl acetal with the conductive polymer and selectively applying heat, light or pressure, or any combination, to cause the pattern-wise transfer wherein element (b) further includes applying heat in an energy density range from 0.5 to 4 J/cm$^2$; and
    c) subjecting the masked conductive polymer to treatment through the opening that changes the conductivity of the conductive polymer by at least one order of magnitude in areas not covered by the mask.

11. A method of patterning a conductive polymer comprising:
    a) providing a conductive polymer layer coated over a first support;
    b) pattern-wise transferring a layer containing polyvinyl acetal from a second support onto the conductive polymer to form a mask with at least one opening, wherein the layer containing polyvinyl acetal further includes organic or inorganic particles, wherein element (b) includes contacting the layer containing polyvinyl acetal with the conductive polymer and selectively applying heat, light or pressure, or any combination, to cause the pattern-wise transfer wherein element (b), wherein element (b) further includes applying laser light in an energy density range from 0.1 to 2 J/cm$^2$; and
    c) subjecting the masked conductive polymer to treatment through the opening that changes the conductivity of the conductive polymer by at least one order of magnitude in areas not covered by the mask.

12. A method of patterning a conductive polymer comprising:
   a) providing a conductive polymer layer coated over a first support;
   b) pattern-wise transferring a layer containing polyvinyl acetal from a second support onto the conductive polymer to form a mask with at least one opening, wherein the layer containing polyvinyl acetal further includes organic or inorganic particles, wherein the layer containing polyvinyl acetal has a thickness from 0.1 to 10 um; and
   c) subjecting the masked conductive polymer to treatment through the opening that changes the conductivity of the conductive polymer by at least one order of magnitude in areas not covered by the mask.

* * * * *